(12) United States Patent
Oster et al.

(10) Patent No.: US 11,079,674 B2
(45) Date of Patent: Aug. 3, 2021

(54) METHOD AND APPARATUS FOR ASCERTAINING A REPAIR SHAPE FOR PROCESSING A DEFECT OF A PHOTOLITHOGRAPHIC MASK

(71) Applicant: Carl Zeiss SMT GmbH, Oberkochen (DE)

(72) Inventors: Jens Oster, Ober-Ramstadt (DE); Markus Waiblinger, Darmstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 81 days.

(21) Appl. No.: 16/563,731

(22) Filed: Sep. 6, 2019

(65) Prior Publication Data
US 2019/0391482 A1    Dec. 26, 2019

Related U.S. Application Data

(63) Continuation of application No. PCT/EP2018/054782, filed on Feb. 27, 2018.

(30) Foreign Application Priority Data

Mar. 8, 2017 (DE) .......................... 102017203841.1

(51) Int. Cl.
| | | |
|---|---|---|
| *G03F 1/74* | (2012.01) | |
| *G03F 1/36* | (2012.01) | |
| *G03F 1/72* | (2012.01) | |
| *G03F 1/70* | (2012.01) | |

(52) U.S. Cl.
CPC .................. *G03F 1/74* (2013.01); *G03F 1/36* (2013.01); *G03F 1/70* (2013.01); *G03F 1/72* (2013.01)

(58) Field of Classification Search
CPC ..... G03F 1/36; G03F 1/70; G03F 1/72; G03F 1/74
USPC ....................................................... 430/5, 30
See application file for complete search history.

(56) References Cited

U.S. PATENT DOCUMENTS

| | | | |
|---|---|---|---|
| 6,014,456 A | 1/2000 | Tsudaka | |
| 6,187,483 B1 | 2/2001 | Capodieci et al. | |
| 6,591,154 B2 | 7/2003 | Haight et al. | |
| 6,982,136 B1 | 1/2006 | Haidinyak | |
| 8,316,698 B2 | 11/2012 | Budach | |
| 10,060,947 B2 * | 8/2018 | Budach | B82Y 10/00 |
| 2004/0124175 A1 | 7/2004 | Ludwig et al. | |
| 2004/0151992 A1 | 8/2004 | Nagamura et al. | |
| 2006/0024594 A1 | 2/2006 | Schroeder | |
| 2010/0154521 A1 | 6/2010 | Budach | |
| 2010/0266937 A1 | 10/2010 | Zibold et al. | |
| 2014/0165236 A1 | 6/2014 | Budach et al. | |

FOREIGN PATENT DOCUMENTS

| | | | | |
|---|---|---|---|---|
| DE | 10244399 | 4/2004 | ............... | G03F 1/14 |
| DE | 10304674 | 9/2004 | ............... | G03F 7/20 |
| DE | 102007054994 | 5/2009 | ............... | G03F 1/14 |
| DE | 102008062928 | 7/2010 | ............... | G03F 1/00 |
| DE | 102011079382 | 1/2013 | ............... | G03F 1/72 |
| KR | 10-0444558 | 4/2005 | ............... | G03F 1/00 |
| KR | 1020110101163 | 9/2011 | ............... | G03F 1/00 |
| KR | 1020140056279 | 5/2014 | ............... | G03F 1/22 |
| TW | 201310165 | 3/2013 | ............... | G03F 1/72 |

OTHER PUBLICATIONS

The Taiwan Office Action for Taiwan Application No. TW 107107434 dated Mar. 5, 2020 (With English Translation).
The Transmittal of the International Search Report and Written Opinion of the International Searching Authority for International Application No. PCT/EP2018/054782 dated May 11, 2018.
"Ebeam Initiative Apr. 20, 2015 in Yokohama—Japan" by Zeiss.
Chapter 4 "Ion beam techniques and applications" of book "Beam Processing Technologies," edited by N.G. Einspruch, S.S. Cohen and R.N. Singh, in the VLSI Electronics Microstructure Science series, vol. 21, Academic Press, author L.R. Harriot, pp. 190-192 and 203-206 (May 1989).
The Taiwan Office Action for Taiwan Application No. TW 107107434 dated Nov. 12, 2020 (With English Translation).
The South Korean Notice of Reasons for Rejection for South Korean Application No. KR 10-2019-7029412 dated Oct. 13, 2020.
Decision of Rejection issued by the Korean Intellectual Property Office for Korean Patent Application No. 10-2019-7029412 by Examiners Gyeonggu Min and Seongju Yun, dated May 17, 2021 (with English Translation).

* cited by examiner

*Primary Examiner* — Christopher G Young
(74) *Attorney, Agent, or Firm* — Fish & Richardson P.C.

(57) ABSTRACT

The present invention relates to a method for ascertaining a repair shape for processing at least one defect of a photolithographic mask including the following steps: (a) determining at least one correction value for the repair shape of the at least one defect, wherein the correction value takes account of a position of at least one pattern element of the photolithographic mask, said at least one pattern element not contacting the at least one defect; and (b) correcting the repair shape by applying the at least one correction value.

20 Claims, 5 Drawing Sheets

METHOD AND APPARATUS FOR ASCERTAINING A REPAIR SHAPE FOR PROCESSING A DEFECT OF A PHOTOLITHOGRAPHIC MASK

CROSS-REFERENCE TO RELATED APPLICATIONS

This application is a continuation of and claims priority under 35 U.S.C. § 120 from PCT Application No. PCT/EP2018/054782, filed on Feb. 27, 2018, which claims priority from German Application DE 10 2017 203 841.1, filed on Mar. 8, 2017. The entire contents of each of these priority applications are incorporated herein by reference.

TECHNICAL FIELD

The present invention relates to a method and an apparatus for ascertaining a repair shape for processing a defect of a photolithographic mask.

BACKGROUND

As a consequence of the growing integration density in the semiconductor industry, photolithographic masks have to image increasingly smaller structures. Therefore, the production of photomasks becomes ever more complicated and hence also more costly. The decreasing structure dimensions of the photomasks lead to the occurrence of new, additional errors or defects on the photomasks. The increasing outlay during the creation of photomasks with ever smaller structures and the cost pressures accompanied thereby force the repair of defects which arise during the mask production or during the use of the masks in order to avoid the expensive, complete renewed production thereof.

It is necessary to localize the defects on photomasks before these can be repaired. This is effectuated by an optical inspection, where use is preferably made of photons with a short wavelength. In a second step, the localized defects are analyzed by scanning using a particle beam (ions or electrons) from an FIB (focused ion beam) scanning microscope or a scanning electron microscope (SEM). If use is made of an electron beam, the backscatter and secondary electrons released from the electrons of the surface of the photomask to be examined are used to produce an image of the surface of the photomask. If use is made of a focused ion beam, the secondary ions which are analyzed in respect of their mass (SIMS, secondary ion mass spectroscopy) and released from the ions from the substrate surface image, in addition to the secondary electrons, the composition of the irradiated surface.

U.S. Pat. No. 8,316,698 B2 describes difficulties which may occur when analyzing a defect adjoining a pattern element of the photomask. The defect analysis supplies a repair shape for a found defect. The repair shape defines the projection of an identified defect onto the surface of the substrate of a photomask. Here, the projection is carried out perpendicular to the surface of the substrate of the photolithographic mask.

Identified defects of photolithographic masks are preferably corrected by particle-beam-induced processes. Defects which arise by virtue of material being present at points on the substrate of the mask which are intended to be transparent (so-called opaque defects) are typically corrected with the aid of a particle-beam-induced etching process. Defects denoting points at which absorbing pattern material is missing (so-called clear defects) are preferably corrected by use of a particle-beam-induced deposition process. These particle-beam-induced etching and deposition processes are strongly localized processes. Ideally, these localized processing processes are restricted to the diameter of the particle beam on the defect or the repair shape. However, a particle beam cannot be focused onto a punctiform diameter in the mathematical sense. Moreover, the particle-beam-induced processes are not restricted—on account of the movement of the molecules of the etching or deposition gas—to the focus of the particle beam.

A repair or a correction of the defects of photolithographic masks which is only effectuated on the basis of the repair shape may therefore also lead to damage of the substrate of the photomask surrounding the defect in addition to the desired defect correction. Moreover, repairing a defect adjoining a pattern element may also affect this pattern element.

This problem has already been identified. Thus the publication "ebeam Initiative, 20 Apr. 2015 in Yokohama—Japan" by the applicant (www.ebeam.org/docs/ebeam_initiative_zeiss.pfd) describes that an electron beam with low energy is suitable for repairing small defects lying in isolation on the substrate of a photomask, substantially on the basis of the repair shape without correcting the repair shape, with the region in which the substrate of the mask is damaged by the electron-beam-induced etching process being small.

In chapter 4: "Ion beam techniques" of the book "Beam Processing Technologies," edited by N. G. Einspruch, S. S. Cohen and R. N. Singh, in the VLSI Electronics Microstructure Science series, volume 21, Academic Press, the author L. R. Harriot describes the practice of scanning an ion beam over the defect for the removal of the latter, with the ion beam remaining at a distance of one beam diameter from the edge of the defect.

The U.S. Pat. No. 6,591,154 B2 explains a method for maintaining a distance from the edge of the defect when correcting defects on wafers or masks. To this end, the operator of a repair apparatus draws a polygon around the defect to be corrected. The distance of an ion beam or a laser beam from the edge of the defect is set by the line width of the polygon and hence the repair shape of the defect is adapted or corrected (biased).

In the cited documents, a correction value or adaptation value (bias) is used to adapt the whole repair shape of a defect or at least part of the repair shape that adjoins the substrate of the mask or a pattern element to the subsequent correction process. On account of the decreasing size of structures or pattern elements of photomasks, this approach for adapting the repair shape no longer suffices for future masks.

Therefore, the present invention is based on the object of specifying a method and an apparatus for ascertaining a repair shape for a defect of a photolithographic mask, which avoid the aforementioned disadvantages when ascertaining the repair shape at least in part.

SUMMARY

In accordance with one exemplary embodiment of the present invention, this problem is solved by a method for ascertaining a repair shape for processing at least one defect of a photolithographic mask, in which the method includes the following steps: (a) determining at least one correction value for the repair shape of the at least one defect, wherein the correction value takes account of a position of at least one pattern element of the photolithographic mask, said at least one pattern element not contacting the at least one defect; and (b) correcting the repair shape by applying the at least one correction value.

Consequently, a method according to the invention takes account of not only the pattern element or pattern elements of a photomask which adjoin a defect but also pattern elements localized in the vicinity of the defect. The method according to the invention causes no additional apparatus outlay since a particle beam installation is required in any case for the purposes of localizing and processing the defect. The expression "in the vicinity of the defect" relates to a distance of the pattern element from the defect which is only so small that the pattern element, at least in parts, lies in the processing zone of the defect during a processing process of the defect and, as a result thereof, it may be modified by the processing process. The expression in the vicinity of the defect consequently depends on the apparatus capabilities of the defect processing installation under consideration.

According to a further exemplary embodiment, the problem as specified in the preceding section is solved by a method for ascertaining a repair shape for processing at least one defect of a photolithographic mask, in which the method includes the following steps: (a) determining at least one correction value for the repair shape of the at least one defect, wherein the correction value takes account of a lateral extent of the at least one defect on a surface of a substrate of the photolithographic mask; and (b) correcting the repair shape by applying the at least one correction value.

A method according to the invention considers the lateral extent of a defect when determining correction values for a repair shape of said defect. As a result, the outlay of the defect processing process or of the defect correcting process is taken account of when correcting the repair shape. Hence, the time duration of the defect processing process is taken into account since the surroundings of the defect may be influenced during at least some of this time interval. Consequently, a method according to the invention goes beyond a correction of the repair shape in which the edge of a defect is reduced by a predetermined amount, depending on whether the defect adjoins a pattern element or ends on the substrate of the mask.

Within this application, the expression "lateral extent" describes a projection of the defect onto the plane forming the unperturbed surface of the substrate of the photolithographic mask. Here, the projection is effectuated substantially perpendicular to the surface of the substrate.

Within this application, the expression "substantially" describes a measurement variable within the error specification if measurement appliances according to the prior art are used.

According to another exemplary embodiment, the problem explained above is solved by a method for ascertaining a repair shape for processing at least one defect of a photolithographic mask, in which the method includes the following steps: (a) determining at least one correction value for the repair shape of the at least one defect, wherein the correction value takes account of a form of the at least one pattern element of the photolithographic mask, said at least one pattern element contacting the at least one defect; and (b) correcting the repair shape by applying the at least one correction value.

A method according to the invention considers a boundary of a defect with a pattern element not only by way of a constant correction value for the repair shape but, instead, takes account of the shape of the common boundary of the defect and of the pattern element. This is particularly advantageous since the particle beam of the scanning particle beam microscope causes an increased secondary electron emission or secondary ion emission at the edges of a pattern element during the repair of the defect; this, for example, may lead to so-called "river-bedding." As a result, the correction of the repair shape determined with the aid of a method according to the invention goes far beyond the prior art.

The at least one correction value may take account of a lateral dimension of the at least one pattern element.

Processing a defect adjoining a pattern element represents a compromise between the degree of correction of the defect along the boundary and the extent of the damage to the adjoining pattern element. By virtue of considering the lateral dimension of the pattern element along the common boundary, it is possible to locally optimize the compromise.

Within this application, the expression "lateral dimension of the pattern element" means the extent of the pattern element in a plane parallel to the surface of the substrate of the photolithographic mask.

The at least one correction value may take account of at least one corner of the at least one pattern element.

In addition to the lateral dimensions of the pattern element adjoining a defect, the correction of the repair shape may likewise consider the specifics occurring at a corner of the pattern element.

The at least one correction value may lead to a reduction in the repair shape in the vicinity of the at least one corner of the at least one pattern element in comparison with a correction value in the vicinity of a straight-lined region of the pattern element if the corner protrudes into the at least one defect and/or the at least one correction value may lead to an increase in the repair shape in the vicinity of the at least one corner of the at least one pattern element in comparison with a correction value in the vicinity of a straight-lined region of the pattern element if the at least one defect protrudes into the corner of the at least one pattern element.

The at least one correction value may take account of the lateral dimension of the at least one pattern element and the at least one corner of the at least one pattern element.

Determining the at least one correction value may further include: taking account of a thickness and/or a material composition of the at least one pattern element.

The thickness of the pattern element which has a common boundary with the defect has an influence on the processing process of the defect for the removal of the latter. The material composition of the pattern element influences the extent of the damage suffered by the pattern element during a defect correction process. The methods described here facilitate taking into account said aspects when correcting the repair shape for the purposes of finding a best-possible compromise between a defect correction and a change in the pattern element along the common boundary.

Determining the at least one correction value may further include: taking account of the thickness and/or a material composition of the at least one defect.

The thickness and the material composition have a decisive influence on the outlay required for removing the defect. By virtue of these parameters being included in the correction values of the repair shape, the repair process of the defect is optimized and, at the same time, impairment of the photomask is minimized.

Processing the at least one defect may include: carrying out a particle-beam-induced etching process and/or a particle-beam-induced deposition process on the corrected repair shape of the at least one defect.

Defects in the form of excess material, for example excess absorber material of a pattern element (so-called opaque defects), are usually processed by use of a particle-beam-induced etching process. By way of example, a particle-beam-induced etching process may be corrected using an electron beam and one or more etching gases, which are provided locally at the incident location of the electron beam. By way of example, an etching gas may comprise xenon difluoride ($XeF_2$), a halogen and/or a gas containing a halogen.

Defects in the form of missing material, for example missing absorber material of a pattern element (a so-called clear defect), are usually corrected by use of a particle-beam-induced deposition process. By way of example, a particle-beam-induced deposition process may be corrected using an electron beam and one or more deposition gases, which are provided locally at the incident location of the electron beam. Chromium hexacarbonyl ($Cr(CO)_6$) is an example for a deposition gas.

Determining the at least one correction value may comprise approximating the at least one correction value on an empirical basis. To this end, the defects to be analyzed are preferably assigned to different classes of defects having different parameters. On the basis of an advancing number of defect processing operations, it is possible to update the classes of the defects and the parameter sets thereof.

Determining the at least one correction value may include analyzing a test mask.

Applying the at least one correction value may include: reducing an area of the repair shape by correcting at least part of an edge of the repair shape.

Hence, the outer contour of the repair shape is adapted locally to the defect itself and to the surroundings of the defect. Here, it is not only the surroundings adjoining the defect that are considered, but also the surroundings of the defect that lie in the interaction region of the processing process.

Determining the at least one correction value may comprise combining the at least one correction value according to the second and third of the above-described embodiments.

Determining the at least one correction value may comprise combining the at least one correction value according to the first embodiment and the second embodiment.

Combining the at least one correction value from two embodiments may comprise a linear combination.

Determining the at least one correction value may include: averaging at least a part of the edge of the at least one defect which does not contact the at least one pattern element; and determining a perpendicular to the tangent to the averaged edge of the at least one defect for ascertaining the distance of the averaged edge from the at least one pattern element which does not contact the at least one defect and the lateral extent of the at least one defect on the surface of the substrate.

Determining the at least one correction value may include: forming a perpendicular in the region of the at least one pattern element which contacts the at least one defect, for the purposes of determining the lateral extent of the at least one defect and the lateral extent of the at least one pattern element which contacts the at least one defect.

A computer program may contain instructions which, when executed by a computer system, prompt the computer system to carry out the method steps of the aspects explained above.

In an exemplary embodiment, an apparatus for ascertaining a repair shape for processing at least one defect of a photolithographic mask has: (a) a measuring unit embodied to ascertain the repair shape; (b) a computing unit embodied to determine at least one correction value for the repair shape of the at least one defect, wherein: (i) the at least one correction value takes account of a position of at least one pattern element of the photolithographic mask, said at least one pattern element not contacting the at least one defect; (ii) the at least one correction value takes account of a lateral extent of the at least one defect on a surface of a substrate of the photolithographic mask; and/or (iii) the at least one correction value takes account of a form of the at least one pattern element of the photolithographic mask, said at least one pattern element contacting the at least one defect; and wherein (c) the computing unit is further embodied to correct the repair shape by applying the at least one correction value.

The apparatus may be embodied to carry out the method steps of the above-described aspects.

DESCRIPTION OF DRAWINGS

The following detailed description describes currently preferred exemplary embodiments of the invention, with reference being made to the drawings, in which.

DETAILED DESCRIPTION

Preferred embodiments of the methods according to the invention and of the apparatus according to the invention are explained in more detail below. However, the methods according to the invention are not restricted to the exemplary applications explained in the following. Instead, the methods described herein may be used for determining a repair shape for defects which may occur in all types of photomasks. Moreover, the methods described in this application are not restricted to correcting defects of photomasks. Instead, these methods and the corresponding apparatus may also be used, for example, for determining a repair shape for defects of integrated circuits.

Figure 1:
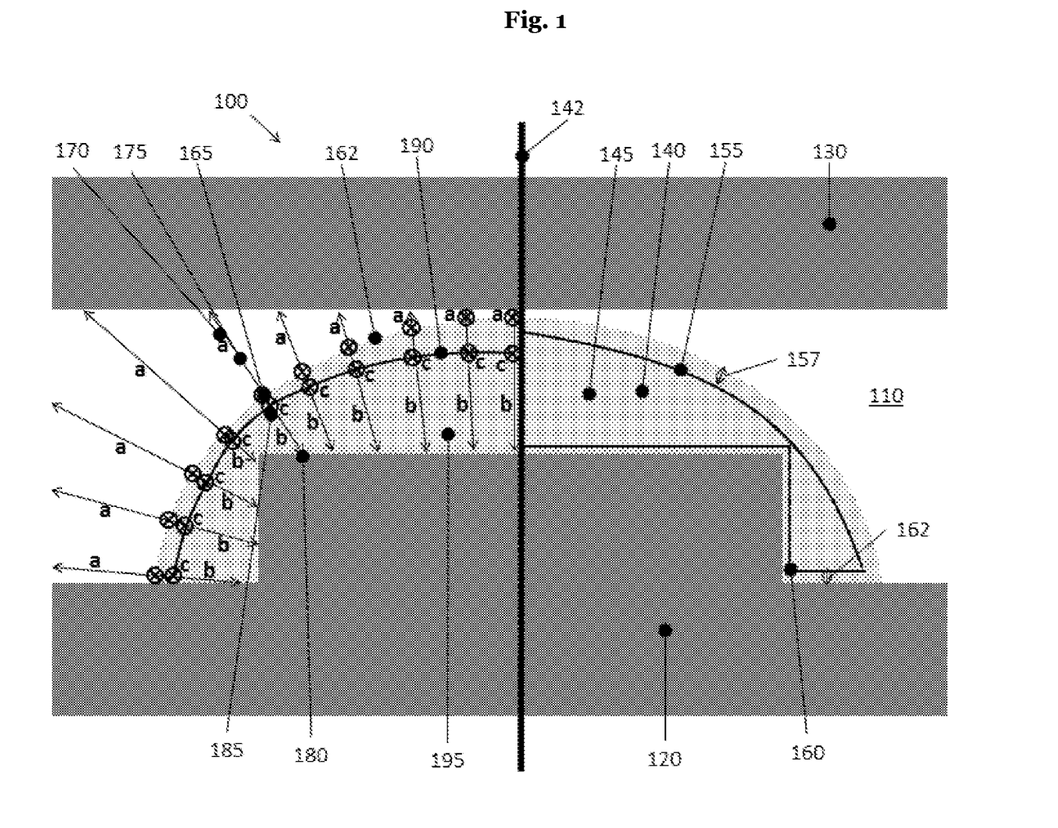
FIG. 1 illustrates the correction of a repair shape of a defect of a photolithographic mask according to the prior art in the right partial image and schematically shows the correction of a repair shape according to two of the methods described in this application in the left partial image.

In the right partial image, i.e. to the right of the vertical line 142, FIG. 1 shows the correction of a repair shape according to the prior art. The mask 100 comprises a substrate 110 and the pattern elements 120 and 130. The photomask 100 is a transmissive mask in the example of FIG. 1. The substrate 110 of the mask 100 often comprises quartz. The pattern elements 120 and 130 substantially completely absorb optical radiation in the actinic wavelength range of the photolithographic mask. The pattern elements 120 and 130 comprise chromium or opaque, MoSiON-based (molybdenum silicon oxynitride) absorbers as absorbing material. The methods described below for determining correction values for a repair shape may be used for all types of photomasks 100, including masks for the extreme ultraviolet (EUV) wavelength range and so-called NIL masks, i.e. masks for nano-imprinted technology (not illustrated in FIG. 1).

The mask 100 has a defect 140 abutting against the pattern element 120. By way of example, the defect 140 may comprise excess absorber material (opaque defect). If this applies, the defect 140 could have substantially the same height as the pattern elements 120, 130. However, the opaque defect 140 may have any height. It is also possible that the defect has a different material or different material composition to the pattern elements 120, 130. Further, it is also possible for the defect 140 to be a defect of missing absorber material (clear defect; not shown in FIG. 1). Moreover, the defect 140 may comprise excess or missing substrate material (likewise not illustrated in FIG. 1).

The defect 140 is preferably detected using an inspection tool and analyzed using a scanning particle beam microscope, often a scanning electron microscope. Then, the defective position is compared to a defect-free position of the photomask 100, said defect-free position having the same pattern structure as the position afflicted by the defect. Alternatively, the defective position may be compared to design data of the defective mask section. The repair shape 145 of the defect 140 is obtained by subtracting the defect-free mask section from the section having the defect. Consequently, the repair shape 145 is the projection of the defect 140 onto the plane of the surface of the substrate 110 of the mask 100. In this representation, an image of the repair shape only contains the defect itself, without the pattern elements 120 and 130 of the corresponding mask section. However, the pattern elements 120 and 130 are reproduced in the exemplary representation of FIG. 1 and in the subsequent figures for illustrative reasons. A computing unit of a scanning particle beam microscope can be used for determining the repair shape 145 of the defect 140.

As explained in the introductory part of the description, processing the defect 140 on the basis of the repair shape 145 leads to a comprehensive correction of the defect 140. However, on account of the lateral extent of the processing zone, the defect processing damages both the substrate 110 of the mask 100 and the pattern element 120 adjoining the defect 140. Moreover, processing the defect 140 may modify the pattern element 130, which does not have a common boundary with the defect 140 but which is localized, at least in part, in the vicinity of the defect 140.

Therefore, the repair shape 145 of the defect 140 is corrected in the prior art. This is carried out, firstly, by virtue of the repair shape 145 of the defect 140 being corrected by a fixed distance 157 along the boundary of the defect 140 with respect to the surrounding substrate 110 such that the corrected repair shape has the new boundary 155 along the substrate 110. This correction of the repair shape 145 is also referred to as edge bias.

The repair shape 145 is likewise corrected by a fixed value 162 along the common edge of defect 140 and pattern element 120 such that the corrected repair shape has the new edge 160 along the pattern element 120. This correction of the repair shape 145 is also denoted as volume bias. The volume bias and the edge bias may have the same distances 157 and 162. However, the distances 157 and 162 are typically different correction values for the repair shape 145. Consequently, the repair shape 145 of the defect 140 has two correction values, with the aid of which the entire outer contour of the repair shape 145 of the defect 140 is corrected.

The left partial image in FIG. 1 shows the mask section of the mask 100 and of the defect 140, axially mirrored at the vertical line 142. This partial image is now used to explain part of the methods, described in this application, for determining correction values for the repair shape 145 of the defect 140. In the first step, the tangent of the edge 162 is determined at predetermined points 165 of the repair shape 145 or of the defect 140 which adjoins the substrate 110. If, unlike what is illustrated in FIG. 1, the defect 140 does not have a smooth edge 162, there is averaging over a predetermined portion of the edge 162 before the tangent is ascertained.

Thereupon, the perpendicular 170 to the tangent is drawn and the points of intersection thereof with the pattern elements 120 and 130 are determined. The distance $a_i$ 175 of the point 165 of the edge 162 is taken into account when ascertaining the correction values for the repair shape 145, even though the pattern element 130 does not have any direct contact with the repair shape 145 of the defect 140. Here, the size of the local correction value $C_i$ 185 depends on the distance $a_i$ 175 of the pattern element 130 from the edge 162 of the repair shape 145 at the point 165:

$$C_i = f_1(a_i) \tag{1}$$

The function $f_1$ may consider the distances $a_i$ to the pattern element 130 in a nonlinear manner. To a first approximation, $f_1$ is, however, a linear function of the distances $a_i$. Additionally, the correction values $C_i$ may contain a constant correction contribution which, however, is suppressed in equation (1). For the accuracy of the correction values 185, it is expedient if the distances $b_i$ 180 of the points 165 of the edge 162 of the repair shape 145 from the pattern element 120, which is in contact with the defect 140, are also taken into account in addition to the distances $a_i$ to the pattern element 130. This is important, in particular, at the points of the repair shape 145 at which the lateral dimension 180 of the defect 140, and hence of the repair shape 145, is small. As a result, equation (1) is extended to:

$$C_i = f_1(a_i) + f_2(b_i) \tag{2}$$

Unlike the prior art, equation (2) describes local, spatially dependent correction values 185 of the defect 140. The correction values 185 of the equation (2) may be complemented to a continuous curve 190. In the example illustrated in FIG. 1, the correction values 185 and/or the closed curve 190 are used to produce a corrected repair shape 195.

It is also possible to determine correction values for the defect 140 which only consider the lateral extent of the defect 140, i.e. on the basis of $f_2(b_i)$, and ignore the influence of the defect processing process on the pattern element 130.

Figure 2:
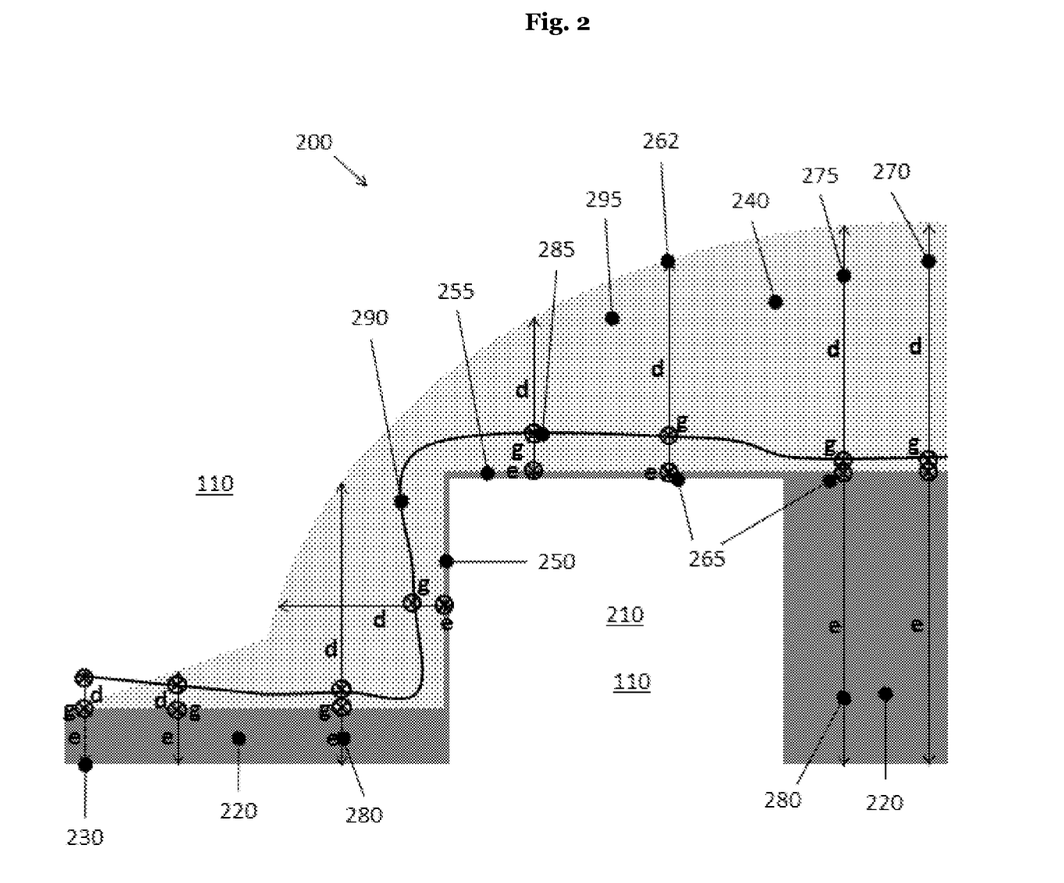
FIG. 2 schematically presents correction values of a repair shape for a defect adjoining a pattern element, wherein the lateral dimensions of the defect and of the pattern element vary perpendicular to the boundary line of the defect and of the pattern element.

Like FIG. 1, FIG. 2 illustrates a section of a photomask 100. This example should be used to discuss determining part of a repair shape for the defect 240 along the common boundary of the pattern element 220 and of the defect 240. FIG. 2 shows the left partial image of FIG. 1 with two differences. Firstly, the defect 240 has a different shape at the left edge than the defect 140 of FIG. 1. Secondly, the pattern element 220 has a different shape than the pattern element 120 of FIG. 1.

A perpendicular 270 to the edge 250 of the pattern element 220 is ascertained at different points 265 of the edge 250 for the purposes of determining the correction values for the repair shape. The distances $d_i$ 275 describe the distance of the edge 262 of the defect 240 from the points 265 of the common edge 262 of the defect 240 and of the pattern element 220. The distances $e_i$ 280 denote the distance of the edge 230 of the rear end of the pattern element 220 from the points 265 of the common edge 250 of the defect 240 and of the pattern element 220. On the basis of these definitions, it is possible to introduce correction values $K_i$ 285 which consider the local lateral extents of both the defect 240 and the pattern element 220:

$$K_i = f_3(d_i) + f_4(e_i) \tag{4}$$

The corrections $K_i$ 285 along the common edge 250 of the defect 240 with the pattern element 220 at the points 265 may, once again, be complemented to form a continuous line 290. The corrections $K_i$ 285 and 290 along the line of contact between the defect 240 and the pattern element 220 is part of the repair shape 295 for the defect 240. As already explained in the discussion relating to equation (1), the functions $f_3$ and $f_4$ may consider the distances $d_i$ of the defect 240 and the lateral dimensions $e_i$ of the pattern element 220 in a nonlinear manner. However, to a first approximation, it is often sufficient to consider $f_3$ and $f_4$ as a linear function of the lateral dimensions $d_i$ and $e_i$.

For as long as the dimensions $d_i$ 275 and $e_i$ 280 are very much larger than the diameter of the processing zone of the defect processing process, a single correction value suffices to correct the repair shape of the defect 240 in this region of the common boundary line. This situation is illustrated at the right edge in FIG. 2. In this limit case, the correction of the repair shape 295 discussed here merges into the previous correction used for the volume bias.

In the central image region of FIG. 2, the defect 240 adjoins only a narrow web 255 of the pattern element 220. The correction values $K_i$ 285 are significantly increased in this region in order to avoid irreparable damage to the pattern element 220 in the region of the narrow web 255 when processing the defect 240. This means that the small distances $e_i$, and hence the function $f_4$, determine the correction values $K_i$ 285, and hence the correction of the repair shape 295, in the region of the narrow web 255 of the pattern element 220.

In the region at the left image edge of FIG. 2, the lateral dimension $e_i$ 280 of the pattern element 220 is firstly significantly smaller than in the right part of FIG. 2. Secondly, the lateral dimensions $d_i$ 275 of the defect 240 vary strongly in this region. Therefore, the correction values $K_i$ 285 depend on both functions $f_3$ and $f_4$ of equation (3) in this part of the common boundary of the pattern element 220 and of the defect 240.

On the basis of the correction values 195 of FIG. 1 along the substrate 110 of the photolithographic mask 100 (i.e. the aforementioned edge bias) and on the basis of the correction values 295 of FIG. 2 along the region in which the defect 240 contacts the pattern element 220 (i.e. the aforementioned volume bias), it is possible to ascertain a corrected repair shape for a defect, said corrected repair shape taking account of the lateral dimensions of the defect 140, 240 and of the pattern element 120, 220 at which the defect 140, 240 abuts, and taking account of the distance of the pattern element 130 which is not in contact with the defect 140.

Figure 3:
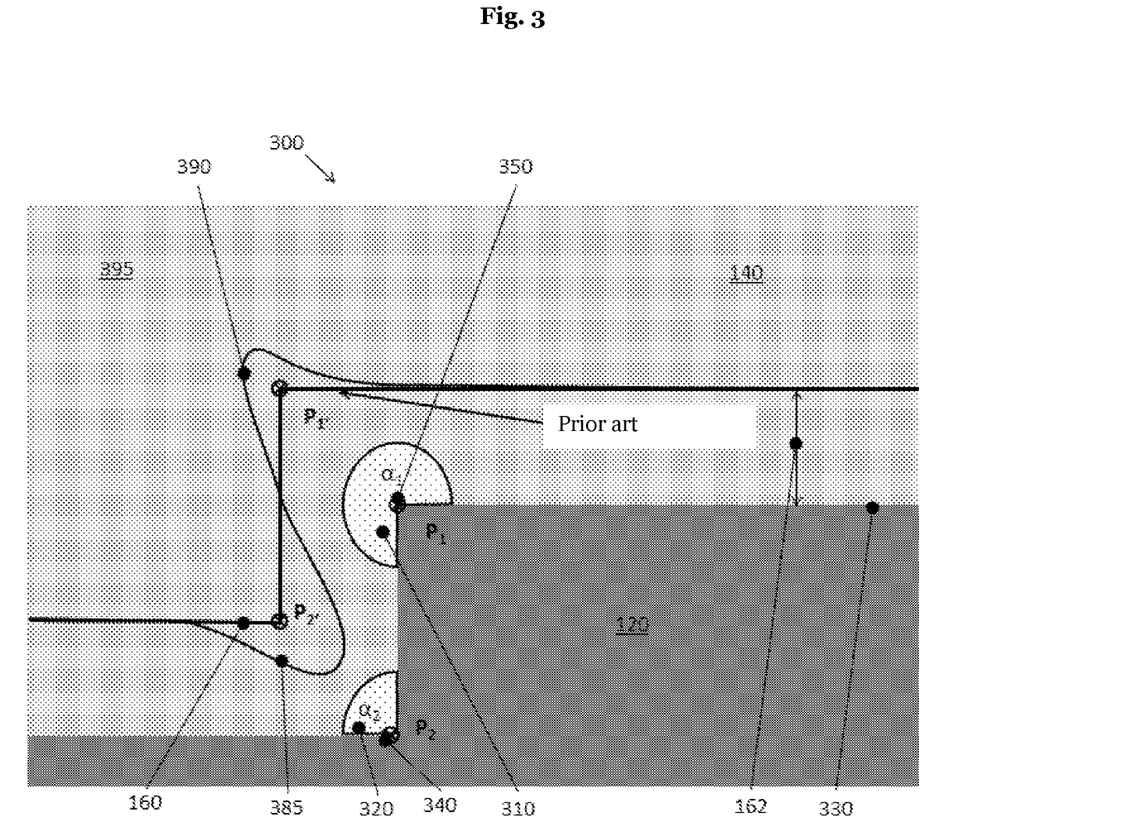
FIG. 3 schematically specifies correction values for a repair shape, wherein a pattern element has two corners in the region in which the defect contacts the pattern element.

FIG. 3 elucidates, in an exemplary manner, the correction of a repair shape of a pattern element contacting the defect, in a region in which the pattern element has a corner. FIG. 3 shows a magnified section of the left partial image of FIG. 1 in the region of the corners of the pattern element 120 and the defect 140 adjoining the pattern element 120. Further, FIG. 3 illustrates a correction according to the prior art. The curve 160 follows the common boundary line 330 of the pattern element 120 and of the defect 140 at a fixed distance 162. The corners $P_1$ and $P_2$ of the pattern element 120 are mapped by the curve 160 into the corners $P_1'$ and $P_2'$.

The curve 385 of FIG. 3 shows the profile of the correction values 385 for the repair shape 395 if the problems of defect processing in the region of the two corners $P_1$ and $P_2$ are taken into account when determining correction values for the repair shape. In the example illustrated in FIG. 3, an ellipse function is used to determine correction values in the region of the two corners $P_1$ and $P_2$. The angle $\alpha_n$ of the corners $P_n$ serves as a parameter. The angles $\alpha_n$ of corners $P_n$ are measured in the region of the defect 140, i.e. outside of the pattern element 120. As may be gathered from FIG. 3, angles $1° \leq \alpha_n \leq 179°$ produce reducing parts of an ellipse in comparison with the correction value of the prior art. By contrast, angles of the range $181° \leq \alpha_n \leq 359°$ generate adding parts of an ellipse in comparison with the correction value of the prior art. The parameters of the reducing ellipse part and of the adding ellipse part are the same for $\alpha_1 = 270°$ and $\alpha_2 = 90°$ to a first approximation. The parameters characterizing the ellipse parts are determined experimentally.

Equation (3) which describes a volume bias, i.e. the correction of a repair shape 295 of a defect 140 adjoining a pattern element 120, is extended by the corner correction:

$$K_i' = K_i + f_5(\alpha_n) \tag{4}$$

where $K_i$ denotes the correction values of equation (3).

An accurate determination of the curve of the repair shape 395 of the defect 140 along the common boundary line 330 or the edge 330 of the pattern element 120 is very important for repairing the defect 140. The particle beam used to repair a defect 140 may have an increased emission rate of secondary electrons in the region of the edge 330 which, when they are incident on the substrate 110 of the photolithographic mask, may lead to so-called "river-bedding."

By using the correction values $C_i$ 190 and $K_i$ 290 or $K_i'$, the repair shape 195, 295 of the defect 140, 240 may be corrected to the best possible extent, without significantly damaging the substrate 110 or the pattern elements 120, 130, 220.

Figure 4:
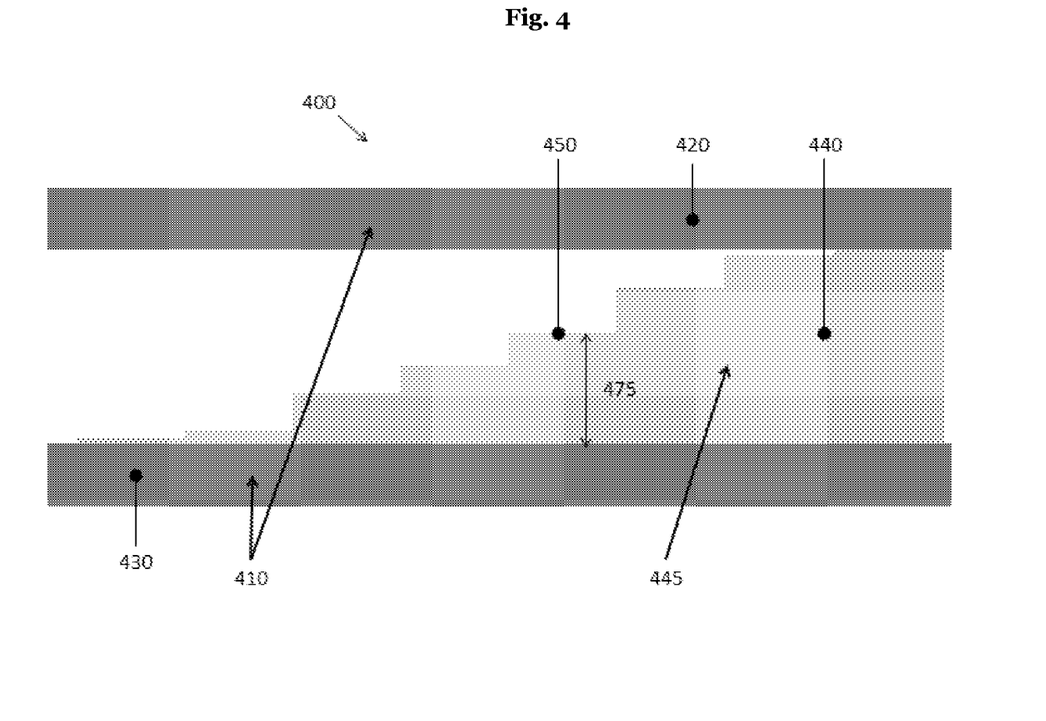
FIG. 4 reproduces a schematic illustration of a test structure for determining correction values of a repair shape for a test defect which abuts a pattern element, has a step-shaped lateral dimension and has a distance from a pattern element that varies.

The diagram 400 in FIG. 4 schematically presents a test structure 410 for determining the correction values $C_i$ of equation (2) and $K_i$ of equation (3). The test structure 410 comprises the two pattern elements 420 and 430 and a test defect 440 made of absorbing material, which is deposited onto the substrate 110 of the test structure 410 with the specific form specified in FIG. 4. The test defect 440 adjoins the pattern element 430 and has lateral dimensions 475 which increase in a step-shaped manner from left to right until the test defect 440 contacts the pattern element 420 with the last step at the right edge of FIG. 4. The test defect 440 produces the repair shape 445. The test defect 440 is removed from the substrate 110 of the test structure 410 with the aid of a particle-beam-induced etching process. Here, the processing process of the test defect 440 is based on the non-corrected repair shape 445.

Figure 5:
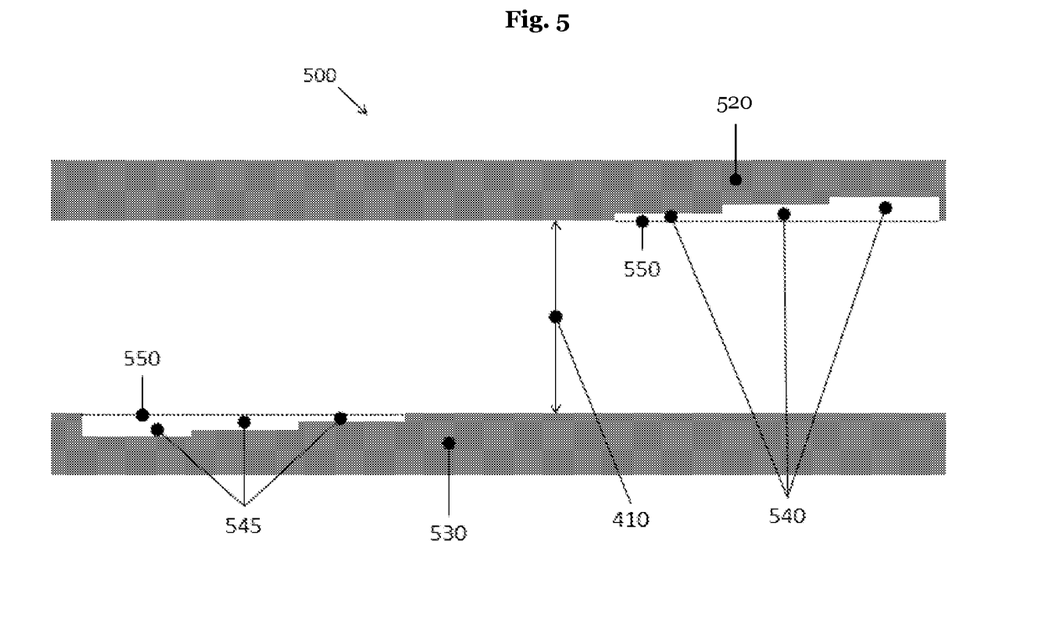
FIG. 5 presents the test structure from FIG. 4 after the removal of the test defect.

The diagram 500 in FIG. 5 shows the test structure 410 of FIG. 4 after etching the test defect 440 on the basis of the non-corrected repair shape 445. Here, only the effects of the particle-beam-induced etching process on the pattern elements 420 and 430 of the test structure 410 are considered. Disadvantageous effects of the processing process of the test defect 440 on the substrate 110 of the test structure remain unconsidered. On account of the non-punctiform processing zone, the etching process of the non-corrected repair shape 445 extends beyond the repair shape. For the pattern elements 520 and 530 this means that, in the region in the test defect 440 comes close to the pattern elements 520 and 530 or the test defect 440 contacts part of the pattern elements 520 and 530, is likewise removed in the particle-beam-induced etching process in comparison with the edge 550 of the original pattern elements 420 and 430. The correction values $C_i$ of equation (2) may be determined from the removed parts 540 and 545 or the deviations 540 and 545 in respect of the original pattern elements 420 and 430.

The pattern elements 520 and 530 in FIG. 5 elucidate the dependence of the processing process on the lateral dimensions of the test defect 440 by way of the deviations 540 and 545 in relation to the original pattern elements 420 and 430. The correction values $K_i$ of equation (3) may be determined on the basis of the processing-process-induced deviations 540 and 545 of the pattern elements 520 and 530.

Figure 6:
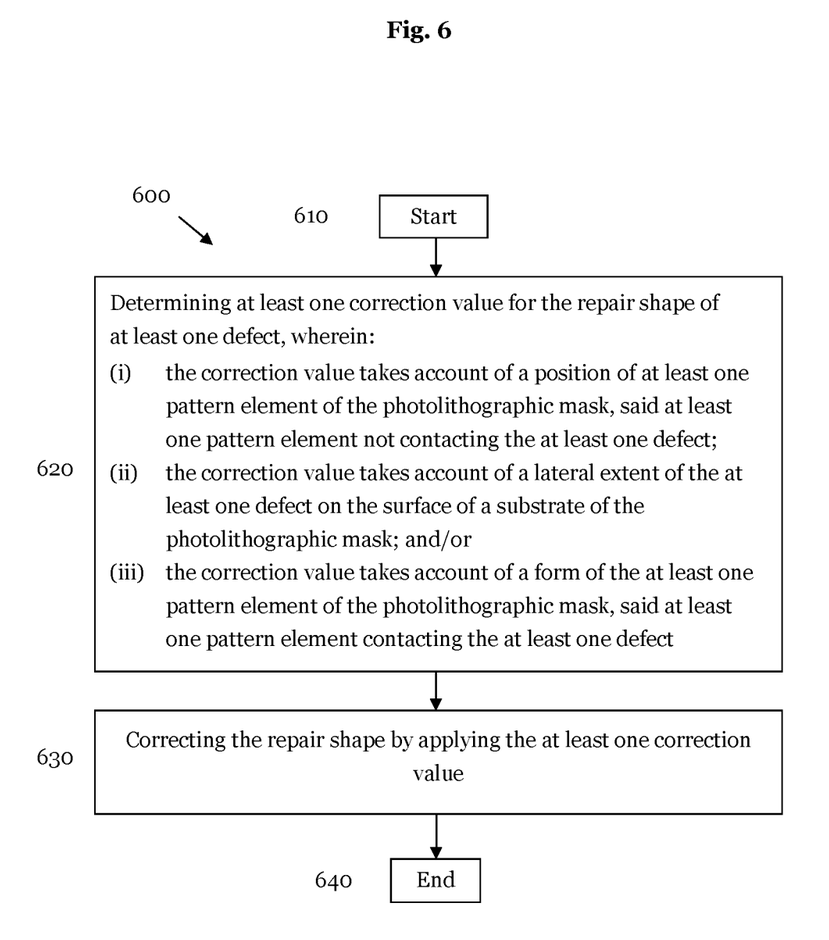
FIG. 6 presents a flowchart of the methods for ascertaining a repair shape for processing a defect of a photolithographic mask.

The flowchart 600 in FIG. 6 presents a method for ascertaining a repair shape for processing a defect of a photolithographic mask. The method begins in step 610. In the second step 620, at least one correction value for the repair shape of at least one defect is determined, wherein:
(i) the correction value takes account of a position of at least one pattern element of the photolithographic mask, said at least one pattern element not contacting the at least one defect;
(ii) the correction value takes account of a lateral extent of the at least one defect on the surface of a substrate of the photolithographic mask; and/or
(iii) the correction value takes account of a form of the at least one pattern element of the photolithographic mask, said at least one pattern element contacting the at least one defect.

In the next step 630, the repair shape is corrected by applying the at least one correction value. The method finally ends at step 640.

What is claimed is:

1. A method for ascertaining a repair shape for processing at least one defect of a photolithographic mask, wherein the method includes the following steps:
   a. determining at least two local spatially dependent correction values for the repair shape of the at least one defect, wherein the at least two local spatially dependent correction values take account of a position of at least one pattern element of the photolithographic mask, said at least one pattern element not contacting the at least one defect; and
   b. correcting the repair shape by applying the at least two local spatially dependent correction values.

2. A method for ascertaining a repair shape for processing at least one defect of a photolithographic mask, wherein the method includes the following steps:
   a. determining at least two local spatially dependent correction values for the repair shape of the at least one defect, wherein the at least two local spatially dependent correction values take account of a lateral extent of the at least one defect on a surface of a substrate of the photolithographic mask; and
   b. correcting the repair shape by applying the at least two local spatially dependent correction values.

3. A method for ascertaining a repair shape for processing at least one defect of a photolithographic mask, wherein the method includes the following steps:
   a. determining at least one correction value for the repair shape of the at least one defect, wherein the correction value takes account of a form of the at least one pattern element of the photolithographic mask, said at least one pattern element contacting the at least one defect; and
   b. correcting the repair shape by applying the at least one correction value.

4. The method according to claim 3, wherein the at least one correction value takes account of a lateral dimension of the at least one pattern element.

5. The method according to claim 3, wherein the at least one correction value takes account of at least one corner of the at least one pattern element.

6. The method according to claim 5, wherein the at least one correction value leads to a reduction in the repair shape in the vicinity of the at least one corner of the at least one pattern element in comparison with a correction value in the vicinity of a straight-lined region of the pattern element if the corner protrudes into the at least one defect and/or wherein the at least one correction value leads to an increase in the repair shape in the vicinity of the at least one corner of the at least one pattern element in comparison with a correction value in the vicinity of a straight-lined region of the pattern element if the at least one defect protrudes into the corner of the at least one pattern element.

7. The method according to claim 5, wherein the at least one correction value takes account of the lateral dimension of the at least one pattern element and the at least one corner of the at least one pattern element.

8. The method according to claim 1, wherein determining the at least two local spatially dependent correction values further includes:
   taking account of a thickness and/or a material composition of the at least one pattern element.

9. The method according to claim 1, wherein determining the at least two local spatially dependent correction values further includes:
   taking account of the thickness and/or a material composition of the at least one defect.

10. The method according to claim 1, wherein processing the at least one defect includes: carrying out a particle-beam-induced etching process and/or a particle-beam-induced deposition process on the corrected repair shape of the at least one defect.

11. The method according to claim 1, wherein determining the at least two local spatially dependent correction values includes analyzing a test mask.

12. The method according to claim 1, wherein applying the at least two local spatially dependent correction values includes: reducing an area of the repair shape by correcting at least part of an edge of the repair shape.

13. The method according to claim 1, wherein determining the at least two local spatially dependent correction values includes combining the at least two local spatially dependent correction values of claim 2 and the at least one correction value of claim 3.

14. The method according to claim 1, wherein determining the at least two local spatially dependent correction values includes combining the at least two local spatially dependent correction values of claims 1 and 2.

15. The method according to claim 13, wherein combining the at least two local spatially dependent correction values of two claims includes a linear combination.

16. The method according to claim 1, wherein determining the at least two local spatially dependent correction values includes: averaging at least a part of the edge of the at least one defect which does not contact the at least one pattern element; and determining a perpendicular to the tangent to the averaged edge of the at least one defect for ascertaining the distance of the averaged edge from the at least one pattern element which does not contact the at least one defect and the lateral extent of the at least one defect on the surface of the substrate.

17. The method according to claim 2, wherein determining the at least two local spatially dependent correction values includes: forming a perpendicular in the region of the at least one pattern element which contacts the at least one defect, for the purposes of determining the lateral extent of the at least one defect and the lateral extent of the at least one pattern element which contacts the at least one defect.

18. A computer program containing instructions which, when executed by a computer system, prompt the computer system to carry out the method steps of claim 1.

19. An apparatus for ascertaining a repair shape for processing at least one defect of a photolithographic mask, said apparatus having:
 a. a measuring unit embodied to ascertain the repair shape;
 b. a computing unit embodied to determine at least one correction value and/or at least two local spatially dependent correction values for the repair shape of the at least one defect, wherein:
  (i) the at least two local spatially dependent correction values take account of a position of at least one pattern element of the photolithographic mask, said at least one pattern element not contacting the at least one defect;
  (ii) the at least two local spatially dependent correction values take account of a lateral extent of the at least one defect on a surface of a substrate of the photolithographic mask; and/or
  (iii) the at least one correction value takes account of a form of the at least one pattern element of the photolithographic mask, said at least one pattern element contacting the at least one defect; and wherein
 c. the computing unit is further embodied to correct the repair shape by applying the at least one correction value and/or the at least two local spatially dependent correction values.

20. The apparatus according to claim 19, embodied to carry out the method steps in claim 1.

* * * * *

UNITED STATES PATENT AND TRADEMARK OFFICE
CERTIFICATE OF CORRECTION

PATENT NO. : 11,079,674 B2
APPLICATION NO. : 16/563731
DATED : August 3, 2021
INVENTOR(S) : Jens Oster and Markus Waiblinger Page 1 of 1

It is certified that error appears in the above-identified patent and that said Letters Patent is hereby corrected as shown below:

In the Specification

Column 9
Line 15 (approx.), delete "(4)" and insert -- (3) --
Line 27, after "$e_i$" insert -- . --

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*